(12) United States Patent
Iwatsu

(10) Patent No.: US 11,322,608 B2
(45) Date of Patent: May 3, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Yasunori Iwatsu, Chigasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 16/816,783

(22) Filed: Mar. 12, 2020

(65) Prior Publication Data
US 2021/0083106 A1    Mar. 18, 2021

(30) Foreign Application Priority Data
Sep. 12, 2019   (JP) .............................. JP2019-166211

(51) Int. Cl.
*H01L 29/78* (2006.01)
*H01L 29/423* (2006.01)
(Continued)

(52) U.S. Cl.
CPC ........ *H01L 29/7816* (2013.01); *H01L 29/086* (2013.01); *H01L 29/0878* (2013.01);
(Continued)

(58) Field of Classification Search
CPC ............. H01L 29/0878; H01L 29/0607; H01L 29/7835; H01L 29/7834; H01L 29/66674;
(Continued)

(56) References Cited

U.S. PATENT DOCUMENTS

2003/0141559 A1* 7/2003 Moscatelli ........ H01L 29/66659
257/406
2007/0063271 A1* 3/2007 Takimoto .......... H01L 29/66681
257/330
(Continued)

FOREIGN PATENT DOCUMENTS

JP        S59-161871 A      9/1984
JP        2009124037 A  *  6/2009   ......... H01L 29/7816
(Continued)

*Primary Examiner* — Errol V Fernandes
*Assistant Examiner* — Jeremy J Joy
(74) *Attorney, Agent, or Firm* — Allen & Overy LLP

(57) ABSTRACT

A semiconductor device includes a first semiconductor layer, a second semiconductor layer provided on a portion of the first semiconductor layer, a third semiconductor layer provided on a portion of the second semiconductor layer and separated from the first semiconductor layer, a fourth semiconductor layer provided on an other portion of the first semiconductor layer, a first insulating film provided on a portion between the third semiconductor layer and the fourth semiconductor layer and on a portion of the fourth semiconductor layer at the second semiconductor layer side, a second insulating film contacting the first insulating film, a third insulating film provided above the second insulating film, and an electrode provided on the first insulating film, on the second insulating film, and on the third insulating film. The second insulating film is provided on the fourth semiconductor layer, and is thicker than the first insulating film.

6 Claims, 6 Drawing Sheets

(51) Int. Cl.
*H01L 29/26* (2006.01)
*H01L 29/08* (2006.01)

(52) U.S. Cl.
CPC ........ *H01L 29/26* (2013.01); *H01L 29/42368* (2013.01); *H01L 29/7835* (2013.01)

(58) Field of Classification Search
CPC ... H01L 29/7816; H01L 29/26; H01L 29/086; H01L 29/42368; H01L 29/66659; H01L 29/66681; H01L 29/0879
See application file for complete search history.

(56) References Cited

U.S. PATENT DOCUMENTS

| | | | | |
|---|---|---|---|---|
| 2009/0072326 | A1* | 3/2009 | Kao | H01L 29/7835 257/409 |
| 2009/0114987 | A1* | 5/2009 | Tanaka | H01L 21/823418 257/335 |
| 2009/0289312 | A1* | 11/2009 | Mori | H01L 27/088 257/409 |
| 2014/0179079 | A1* | 6/2014 | Huang | H01L 29/0607 438/286 |
| 2014/0339634 | A1* | 11/2014 | Landgraf | H01L 29/401 257/339 |
| 2015/0041891 | A1* | 2/2015 | Huang | H01L 29/0847 257/339 |

FOREIGN PATENT DOCUMENTS

| | | |
|---|---|---|
| JP | 2009-283784 A | 12/2009 |
| JP | 5211652 B2 | 6/2013 |

\* cited by examiner

SEMICONDUCTOR DEVICE

CROSS-REFERENCE TO RELATED APPLICATIONS

This application is based upon and claims the benefit of priority from Japanese Patent Application No. 2019-166211, filed on Sep. 12, 2019; the entire contents of which are incorporated herein by reference.

FIELD

Embodiments relate to a semiconductor device.

BACKGROUND

A LDMOS (Laterally Double-Diffused MOSFET) is used as a semiconductor device for power control. It is desirable to realize both a high breakdown voltage in the OFF-state and a low resistance in the ON-state of the LDMOS.

DETAILED DESCRIPTION

A semiconductor device, includes a first semiconductor layer, a second semiconductor layer provided on a portion of the first semiconductor layer, a third semiconductor layer provided on a portion of the second semiconductor layer and separated from the first semiconductor layer, a fourth semiconductor layer provided on an other portion of the first semiconductor layer, a first insulating film provided on a portion between the third semiconductor layer and the fourth semiconductor layer and on a portion of the fourth semiconductor layer at the second semiconductor layer side, a second insulating film contacting the first insulating film, a third insulating film provided above the second insulating film, and an electrode provided on the first insulating film, on the second insulating film, and on the third insulating film. The second semiconductor layer is of a first conductivity type. The third semiconductor layer is of a second conductivity type. The fourth semiconductor layer is of the second conductivity type. The second insulating film is provided on the fourth semiconductor layer, and is thicker than the first insulating film.

Figure 1:
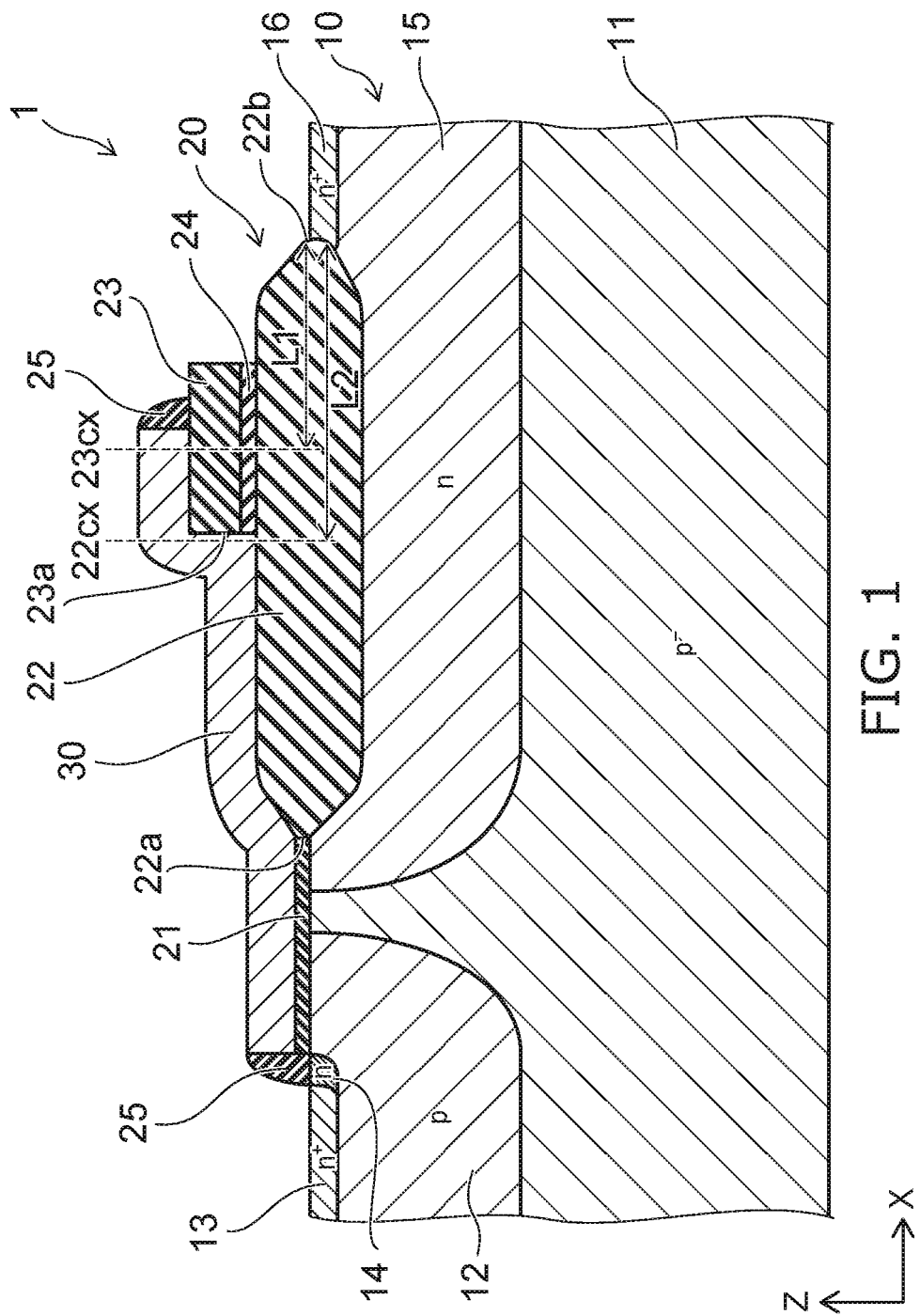
FIG. 1 is a cross-sectional view showing a semiconductor device according to an embodiment.

FIG. 1 is a cross-sectional view showing a semiconductor device according to an embodiment of the invention.

As shown in FIG. 1, the semiconductor device 1 according to the embodiment is a LDMOS (Laterally Double-Diffused MOSFET). A semiconductor portion 10, an insulator portion 20 provided on the semiconductor portion 10, and a gate electrode 30 separated from the semiconductor portion 10 with the insulator portion 20 interposed are provided in the semiconductor device 1.

For example, a well layer 11 (a first semiconductor layer) of a $p^-$-conductivity type is provided in the semiconductor portion 10. For example, a body layer 12 (a second semiconductor layer) of the p-conductivity type is provided on a portion of the well layer 11. The "$p^-$-type" conductivity means that the concentration of the impurity that forms acceptors is lower than that of the "p-type." The conductivity type of the well layer 11 may be an $n^-$-type. In other words, the conductivity type of the well layer 11 and the conductivity type of the body layer 12 may be the same or may be different.

For example, a source layer 13 of the $n^+$-conductivity type is provided on a portion of the body layer 12; and a source extension layer 14 of the n-conductivity type is provided to contact the source layer 13. The "$n^+$-type" conductivity means that the concentration of the impurity that forms donors is higher than that of the "n-type." A third semiconductor layer includes the source layer 13 and the source extension layer 14. The source layer 13 and the source extension layer 14 are separated from the well layer 11; and the body layer 12 is disposed between the source layer 13 and the well layer 11 and between the source extension layer 14 and the well layer 11.

On the other hand, for example, a drift layer 15 of the n-conductivity type is provided on another portion of the well layer 11. For example, a drain layer 16 of the $n^+$-conductivity type is provided on a portion of the drift layer 15. A fourth semiconductor layer includes the drift layer 15 and the drain layer 16. The drain layer 16 is separated from the well layer 11; and the drift layer 15 is disposed between the drain layer 16 and the well layer 11. The drift layer 15 is separated from the body layer 12; and a portion of the well layer 11 is disposed between the drift layer 15 and the body layer 12.

The semiconductor portion 10 includes the well layer 11, the body layer 12, the source layer 13, the source extension layer 14, the drift layer 15, and the drain layer 16. The semiconductor portion 10 includes, for example, silicon (Si) and is formed by, for example, introducing impurities to single-crystal silicon.

A gate insulating film 21 (a first insulating film), a first field insulating film 22 (a second insulating film), a second field insulating film 23 (a third insulating film), an etching stopper film 24 (a fourth insulating film), and a sidewall 25 are provided in the insulator portion 20.

The gate insulating film 21 is disposed on a portion of the semiconductor portion 10 between the source extension layer 14 and the drift layer 15 and on a portion of the drift layer 15 at the body layer 12 side.

The first field insulating film 22 is provided on a portion of the drift layer 15, The first field insulating film 22 contacts the gate insulating film 21. The first field insulating film 22 is thicker than the gate insulating film 21. The first field insulating film 22 may be LOCOS (Local Oxidation of Silicon) or may be STI (Shallow Trench Isolation; an element-separation insulating film).

FIG. 1 shows the case where the first field insulating film 22 is LOCOS. In such a case, the end portion of the first field insulating film 22 has a bird's beak configuration and becomes thinner in a direction toward the tip. For example, the configuration of the first field insulating film 22 becomes thinner toward an end portion 22a at the gate insulating film 21 side. The lower portion of the first field insulating film 22 is positioned lower than a region of the upper surface of the drift layer 15 not contacting the first field insulating film 22, and is disposed between the source layer 13 and the drain layer 16.

The second field insulating film 23 is disposed on the first field insulating film 22, In an X-direction from the gate insulating film 21 toward the first field insulating film 22, the length of the second field insulating film 23 is shorter than the length of the first field insulating film 22. The second field insulating film 23 is not provided on the end portion of the second insulating film having the bird's beak configuration, and is separated from the end portion 22a of the first field insulating film 22 at the gate insulating film 21 side.

In the X-direction, a central position 23cx of the second field insulating film 23 is more proximal to the drain layer 16 than is a central position 22cx of the first field insulating film 22. In other words, in the X-direction, a distance L1 is equal to or shorter than a distance L2, wherein the distance L1 is the distance between the central position 23cx of the second field insulating film 23 and an end portion 22b of the first field insulating film 22 at the side opposite to the gate insulating film 21, and the distance L2 is the distance between the central position 22cx of the first field insulating film 22 and the end portion 22b of the first field insulating film 22. In other words, $L1 \leq L2$.

The etching stopper film 24 is provided between the first field insulating film 22 and the second field insulating film 23. The material of the etching stopper film 24 is different from the material of the first field insulating film 22 and the material of the second field insulating film 23. For example, the gate insulating film 21, the first field insulating film 22, and the second field insulating film 23 are made of silicon oxide (SiO); and the etching stopper film 24 is made of silicon nitride (SiN).

The gate electrode 30 is provided on the gate insulating film 21, on the first field insulating film 22, and on the second field insulating film 23. The gate electrode 30 is made of a conductive material and is made of, for example, polysilicon including an impurity.

The sidewall 25 is provided on the side surface of the gate electrode 30. The source extension layer 14 is provided at the side of the source layer 13 in the region directly under a portion of the sidewall 25 at the source side.

A formation method of the first field insulating film 22 and the second field insulating film 23 in a method for manufacturing the semiconductor device according to the embodiment will now be described.

FIGS. 2A to 2C and FIGS. 3A and 3B are cross-sectional views showing the method for forming the first field insulating film and the second field insulating film of the semiconductor device according to the embodiment.

Figure 2A:
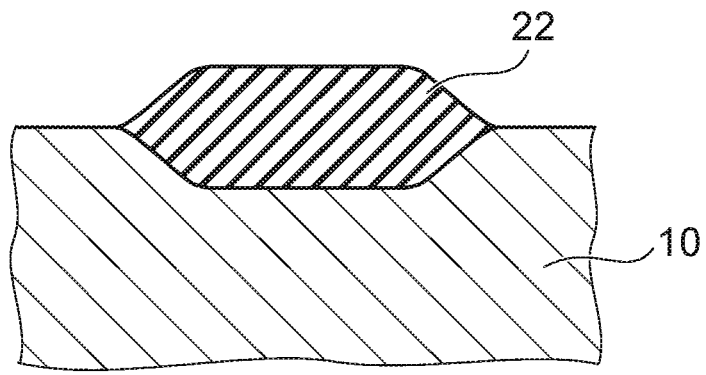
FIGS. 2A to 3B are cross-sectional views showing a method for forming a first field insulating film and a second field insulating film of the semiconductor device according to the embodiment.

First, as shown in FIG. 2A, the first field insulating film 22 is formed by, for example, thermal oxidation at the upper surface of the semiconductor portion 10. In such a case, the first field insulating film 22 is LOCOS; and the end portion of the first field insulating film 22 has a bird's beak configuration. When the semiconductor portion 10 includes silicon, the first field insulating film 22 includes silicon oxide. The first field insulating film 22 may be formed as a STI, In such a case, the first field insulating film 22 is formed by forming a trench in the upper surface of the semiconductor portion 10 and by depositing silicon oxide in the trench.

Figure 2B:
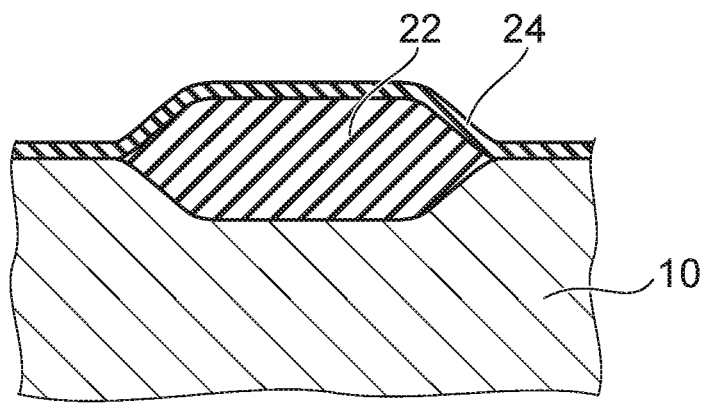

Then, as shown in FIG. 2B, the etching stopper film 24 which is made of a material different from the first field insulating film 22, e.g., silicon nitride is formed on the entire surface. The etching stopper film 24 is formed by, for example, CVD (Chemical Vapor Deposition). The etching stopper film 24 is formed on the semiconductor portion 10 and on the first field insulating film 22.

Figure 2C:
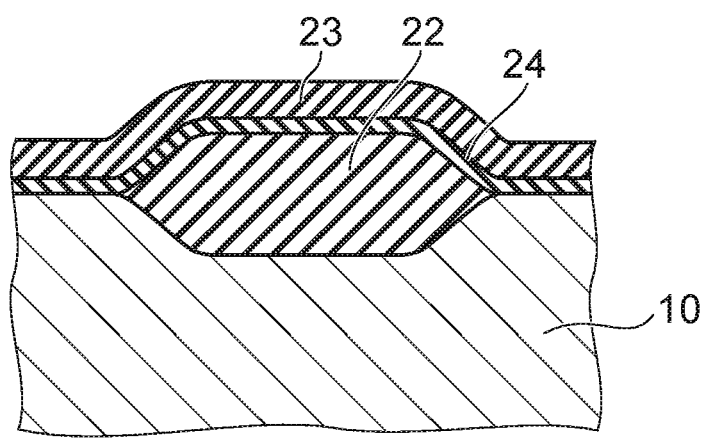

Continuing as shown in FIG. 2C, the second field insulating film 23 is formed on the entire surface. The second field insulating film 23 is formed by, for example, depositing silicon oxide by CVD.

Figure 3A:
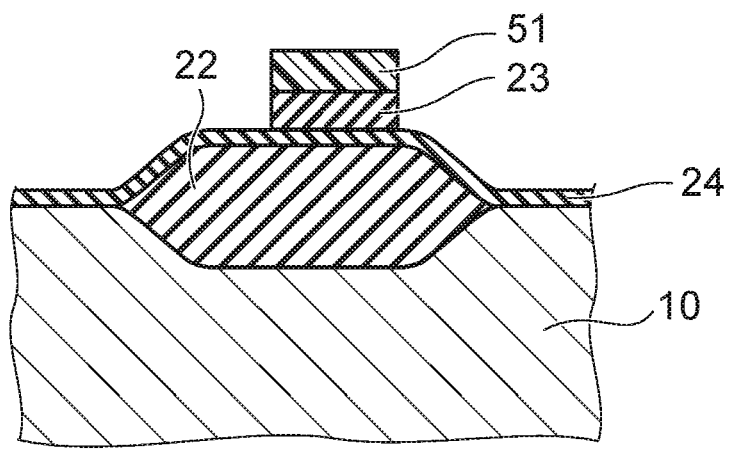

Then, as shown in FIG. 3A, a resist pattern 51 is formed at a portion on the second field insulating film 23 by, for example, lithography. Then, etching such as, for example, RIE (Reactive Ion Etching) or the like is performed using the resist pattern 51 as a mask and the etching stopper film 24 as a stopper. The second field insulating film 23 is selectively removed and patterned thereby. Then, the resist pattern 51 is removed.

Figure 3B:
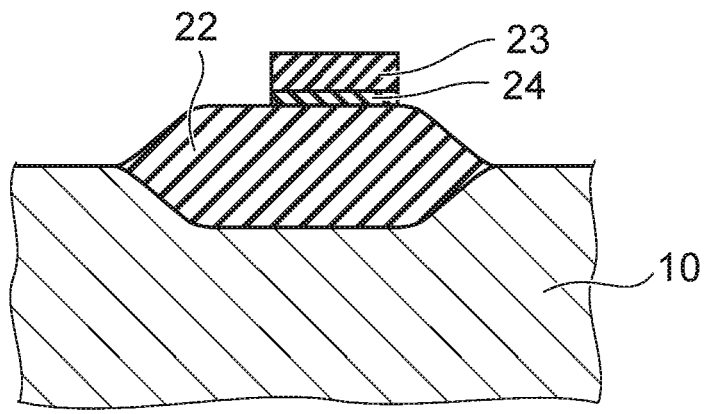

Continuing as shown in FIG. 3B, the etching stopper film 24 is etched. The portion of the etching stopper film 24 not covered with the second field insulating film 23 is removed thereby. In this way, the second field insulating film 23 is formed as a body different from the first field insulating film 22.

Thereafter, the semiconductor layers are formed in the semiconductor portion 10 by ion implantation, etc., using normal methods. The gate insulating film 21, the gate electrode 30, the sidewall 25, etc., also are formed. The semiconductor device 1 is manufactured thereby.

Effects of the embodiment will now be described.

In the semiconductor device 1 according to the embodiment, the gate electrode 30 is disposed not only on the gate insulating film 21 but also on the first field insulating film 22. The concentration of the electric field in the semiconductor portion 10 can be suppressed thereby.

In the embodiment, the second field insulating film 23 is provided on the first field insulating film 22; and the end portion of the gate electrode 30 at the drain side is disposed on the second field insulating film 23. Thereby, the distance lengthens between the semiconductor portion 10 and the end portion of the gate electrode 30 at the drain side where the electric field concentrates particularly easily; and the concentration of the electric field can be suppressed more effectively. As a result, the source-drain breakdown voltage of the LDMOS provided in the semiconductor device 1 is increased.

In the embodiment, by providing the etching stopper film 24 between the first field insulating film 22 and the second field insulating film 23, etching of only the second field insulating film 23 can be performed; and any configuration can be patterned. Thereby, the gate electrode 30 can have any configuration.

Figure 4A:
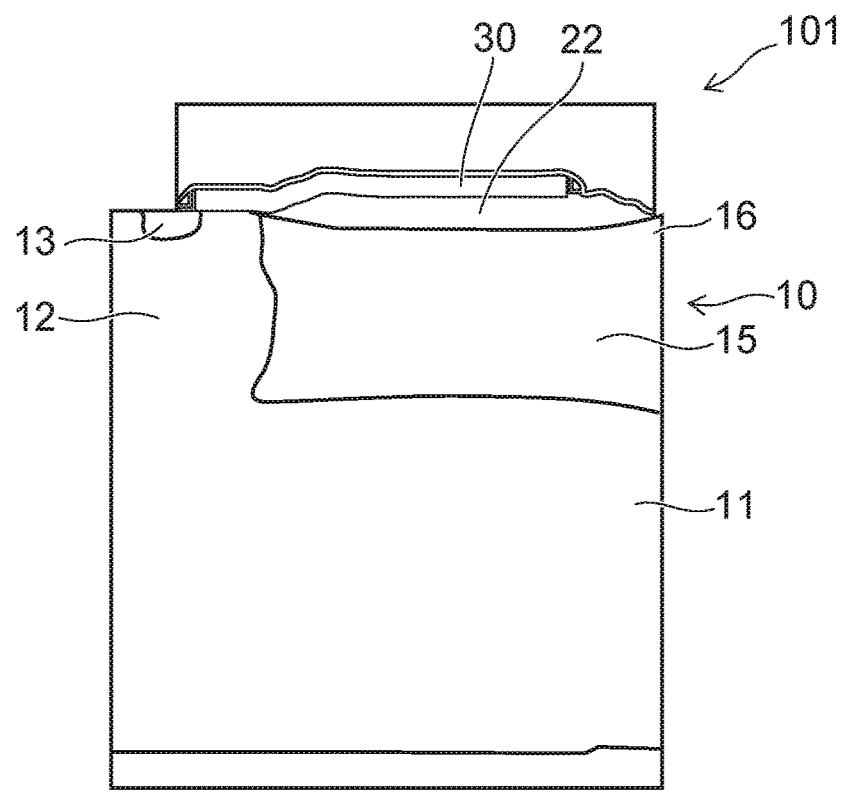
FIG. 4A shows process simulation results assuming a semiconductor device according to a comparative example.
Figure 4B:
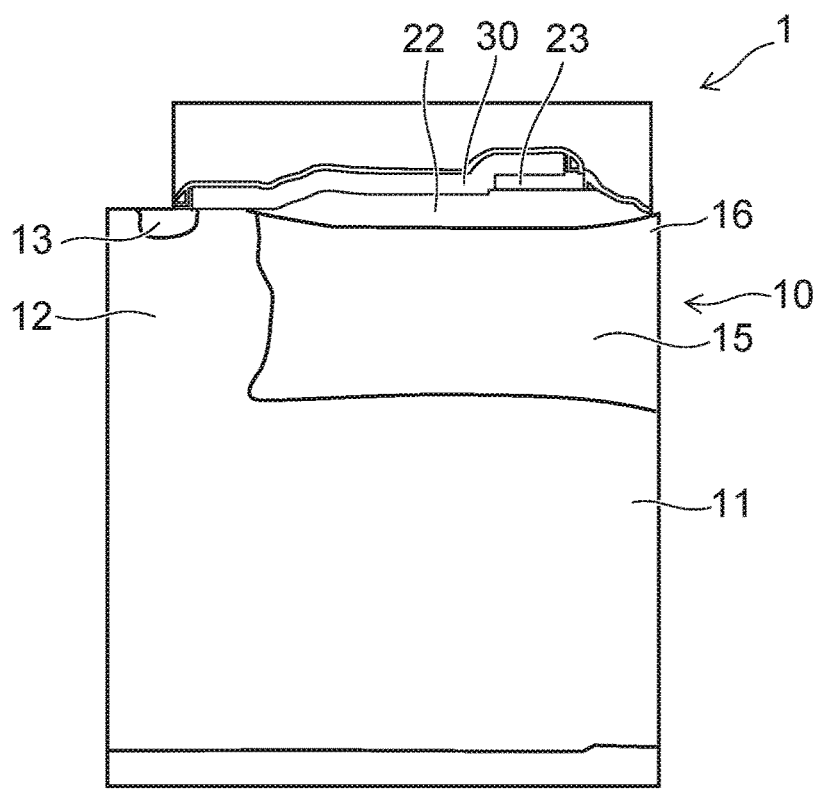
FIG. 4B shows process simulation results assuming the semiconductor device according to the embodiment.

FIG. 4A shows process simulation results assuming a semiconductor device 101 according to a comparative example. FIG. 4B shows process simulation results assuming the semiconductor device 1 according to the embodiment.

Figure 5:
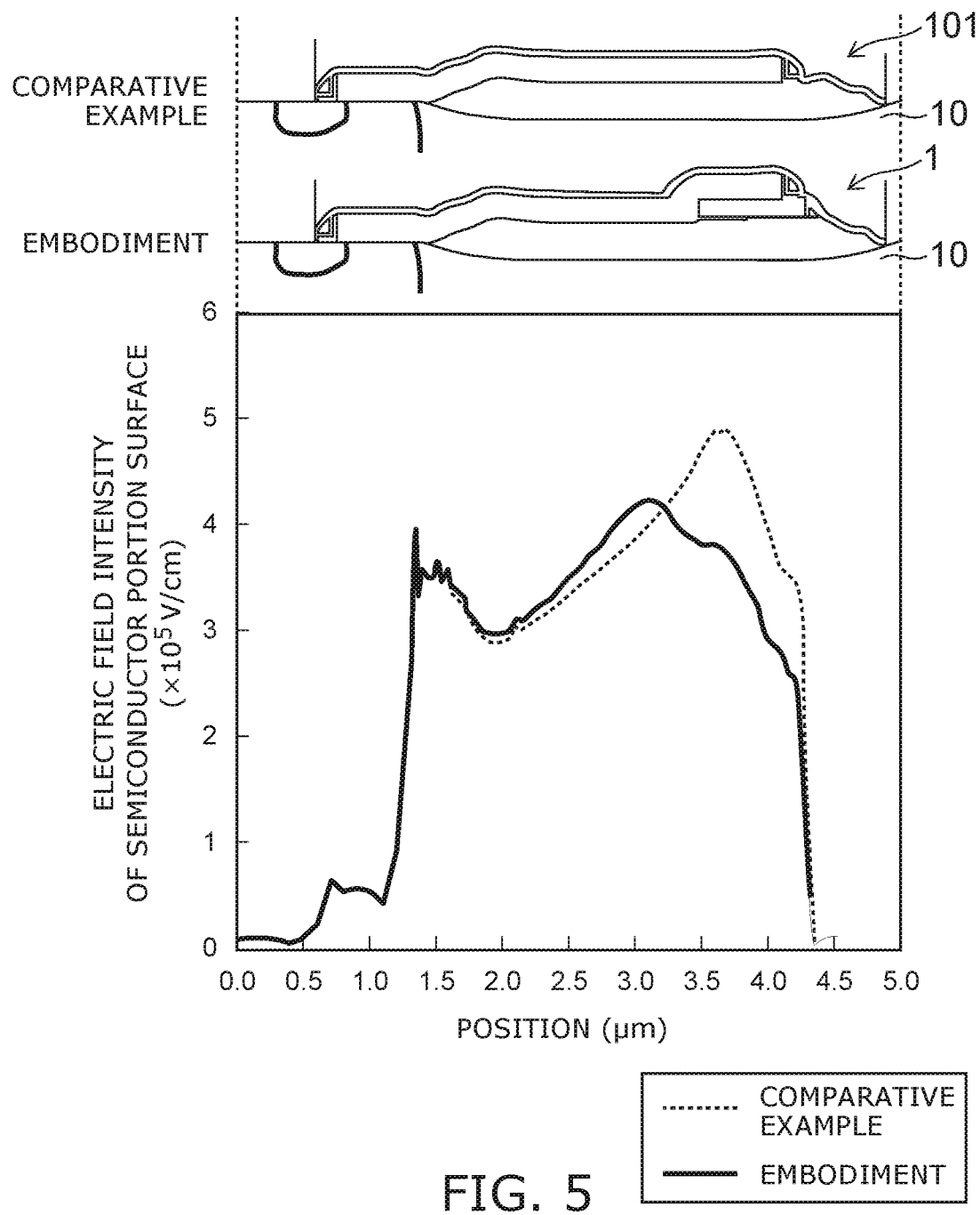
FIG. 5 is a graph showing the device simulation results of the electric field intensity distribution, in which the horizontal axis is the position in the X-direction, and the vertical axis is the electric field intensity.

FIG. 5 is a graph showing the device simulation results of the electric field intensity distribution, in which the horizontal axis is the position in the X-direction, and the vertical axis is the electric field intensity.

The device simulation shown in FIG. 5 assumes that the same source-drain voltage is applied in the semiconductor device 101 according to the comparative example and the semiconductor device 1 according to the embodiment.

As shown in FIG. 4A, the second field insulating film 23 and the etching stopper film 24 are not provided in the semiconductor device 101 according to the comparative example. Conversely, in the semiconductor device 1 according to the embodiment as shown in FIG. 4B, the second field insulating film 23 is provided on the first field insulating film 22; and the end portion of the gate electrode 30 at the drain side is disposed on the second field insulating film 23.

In the semiconductor device 101 according to the comparative example as shown in FIG. 5, the portion on the surface of the semiconductor portion 10 where the electric field is most intense is the portion directly under the end portion of the gate electrode 30 at the drain side. Accordingly, breakdown occurs easily at this portion. Conversely, in the semiconductor device 1 according to the embodiment compared to the semiconductor device 101, the electric field at the portion recited above is weaker because the distance is longer between the semiconductor portion 10 and the end portion of the gate electrode 30 at the drain side. Therefore, the source-drain breakdown voltage of the semiconductor device 1 is higher than that of the semiconductor device 101.

Figure 6:
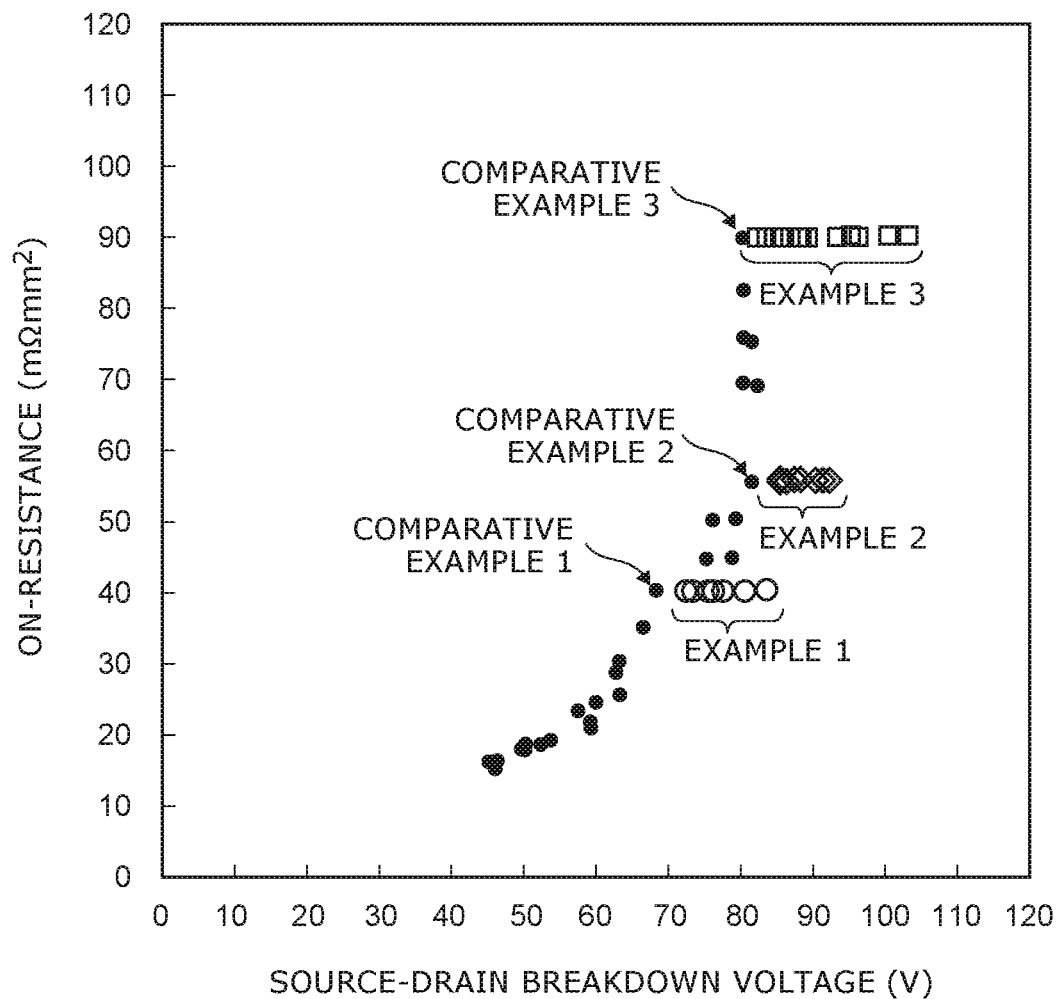
FIG. 6 is a graph showing the balance between the breakdown voltage and the resistance, in which the horizontal axis is the source-drain breakdown voltage in the OFF-state, and the vertical axis is the source-drain resistance in the ON-state.

FIG. 6 is a graph showing the balance between the breakdown voltage and the resistance, in which the horizontal axis is the source-drain breakdown voltage in the OFF-state, and the vertical axis is the source-drain resistance (the ON-resistance) in the ON-state.

As shown in FIG. 6, compared to comparative examples 1 to 3 in which the second field insulating film 23 is not provided, the breakdown voltage is increased while maintaining an equivalent ON-resistance in the examples 1 to 3 of the embodiment in which the second field insulating film 23 is provided.

Thus, according to the embodiment, a semiconductor device can be realized in which it is possible to realize both a high breakdown voltage in the OFF-state and a low resistance in the ON-state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first semiconductor layer;
a second semiconductor layer provided on a portion of the first semiconductor layer, the second semiconductor layer being of a first conductivity type;
a third semiconductor layer provided on a portion of the second semiconductor layer and separated from the first semiconductor layer, the third semiconductor layer being of a second conductivity type;
a fourth semiconductor layer provided on an other portion of the first semiconductor layer, the fourth semiconductor layer being of the second conductivity type;
a first insulating film provided on a portion of the first semiconductor layer and the second semiconductor layer between the third semiconductor layer and the fourth semiconductor layer and on a portion of the fourth semiconductor layer at the second semiconductor layer side;
a second insulating film contacting the first insulating film, being provided on the fourth semiconductor layer, and being thicker than the first insulating film;
a third insulating film provided above the second insulating film;
a fourth insulating film provided between the second insulating film and the third insulating film, the fourth insulating film being made of a material different from a material of the second insulating film and a material of the third insulating film; and
an electrode provided on the first insulating film, on the second insulating film, and on the third insulating film,
wherein in a first direction, a length of the third insulating film is shorter than a length of the second insulating film, the first direction being from the first insulating film toward the second insulating film,
wherein the third insulating film is separated from an end portion of the second insulating film at the first insulating film side,
wherein in the first direction, a first distance between an end portion of the third insulating film at the first insulating film side and an end portion of the second insulating film at a side opposite to the first insulating film is shorter than a second distance between a center of the second insulating film and the end portion of the second insulating film at the side opposite to the first insulating film.

2. The device according to claim 1, wherein
the first insulating film, the second insulating film, and the third insulating film are made of silicon oxide, and
a fourth insulating film is made of silicon nitride.

3. The device according to claim 1, wherein an end portion of the second insulating film at the first insulating film side becomes thinner in a direction toward the first insulating film.

4. The device according to claim 3, wherein the third insulating film is not provided on the end portion of the second insulating film at the first insulating film side.

5. The device according to claim 1, wherein the third insulating film is formed as a body different from the second insulating film.

6. The device according to claim 1, wherein
the third semiconductor layer includes a source layer,
the fourth semiconductor layer includes:
a drift layer; and
a drain layer, an impurity concentration of the drain layer being higher than an impurity concentration of the drift layer, and
a lower portion of the second insulating film is disposed between the source layer and the drain layer.

* * * * *